(12) United States Patent
Muthukumaraswamy et al.

(10) Patent No.: US 6,229,227 B1
(45) Date of Patent: May 8, 2001

(54) PROGRAMMABLE-VALUE ON-CHIP PASSIVE COMPONENTS FOR INTEGRATED CIRCUIT (IC) CHIPS, AND SYSTEMS UTILIZING SAME

(75) Inventors: Kumaraguru Muthukumaraswamy, Santa Clara; Michael D. Rostoker, Boulder Creek, both of CA (US)

(73) Assignee: Kawasaki Steel Corporation, Tokyo (JP)

(*) Notice: Subject to any disclaimer, the term of this patent is extended or adjusted under 35 U.S.C. 154(b) by 0 days.

(21) Appl. No.: 09/221,259

(22) Filed: Dec. 28, 1998

(51) Int. Cl.⁷ .................................................. H03K 19/173
(52) U.S. Cl. ........................ 307/38; 340/825.79; 938/152
(58) Field of Search ................................ 307/38; 438/152; 326/37, 38, 41; 340/825.79, 825.83

(56) References Cited

U.S. PATENT DOCUMENTS

| | | | |
|---|---|---|---|
| 5,298,806 | * | 3/1994 | Sako ........................................ 326/37 |
| 5,544,069 | * | 8/1996 | Mohsen ............................ 340/825.83 |
| 5,563,526 | * | 10/1996 | Hastings et al. ........................ 326/37 |
| 5,747,367 | * | 5/1998 | Kadosh et al. ........................ 438/152 |

* cited by examiner

Primary Examiner—Albert W. Paladini
(74) Attorney, Agent, or Firm—Gerald E. Linden

(57) ABSTRACT

Programmability for on-chip passive components such as resistors, capacitors and inductors is achieved by forming a first passive component such as a resistor, capacitor or inductor, and at least one additional passive component (again, such as resistor, capacitor or inductor), and at least one means for selectively switching selected ones of the at least two additional passive components in series or in parallel with the first passive component are provided on an integrated circuit (IC) chip. The series/parallel connected first passive component and additional passive components are connected between two terminals of the IC chip whereat it is desired to establish a passive component value (e.g., resistance, capacitance or inductance). In this manner, one of a plurality of possible total (overall) values may be established. An integrated circuit (IC) chip incorporating such programmable passive components is suitably included in a system or subsystem having electrical functionality, such as general purpose computers, telecommunications devices, and the like.

17 Claims, 8 Drawing Sheets

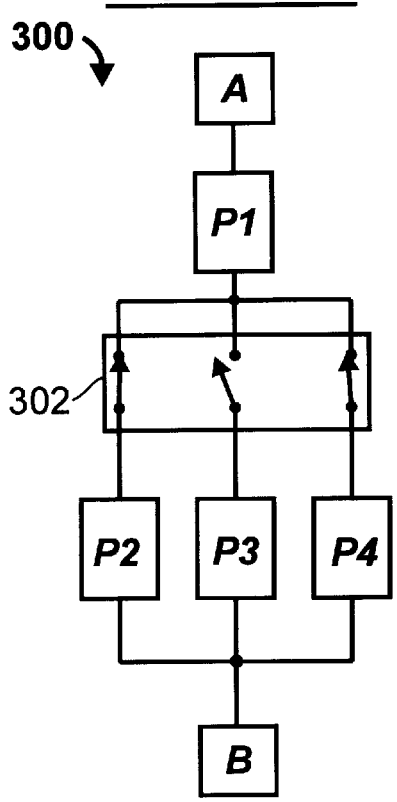
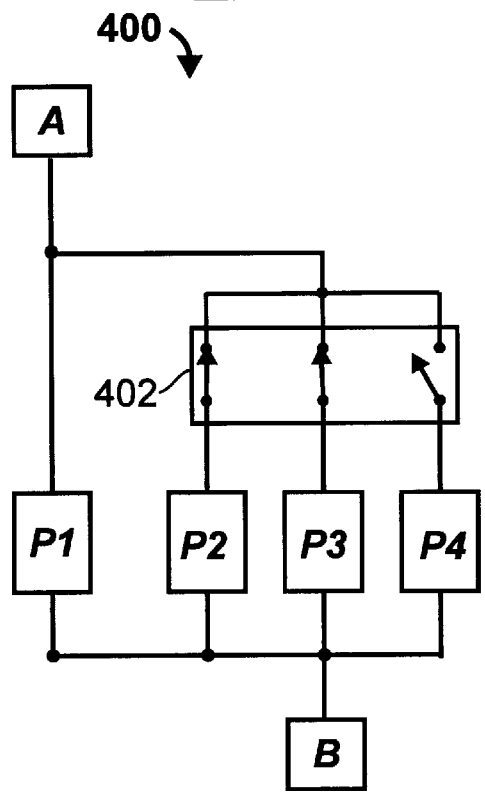

1400

1500

PROGRAMMABLE-VALUE ON-CHIP PASSIVE COMPONENTS FOR INTEGRATED CIRCUIT (IC) CHIPS, AND SYSTEMS UTILIZING SAME

TECHNICAL FIELD OF THE INVENTION

The present invention relates to integrated circuit (IC) chips and, more particularly, to IC chips having passive (analog) components such as resistors, capacitors, and inductors incorporated into their design ("on-chip"), such as is typical of analog and mixed signal designs.

BACKGROUND OF THE INVENTION

MOS technology (particularly CMOS technology) is currently of limited suitability for mixed signal (analog) designs. Thus, most microelectronic devices which operate with real-world signals (such as video, voice, feedback control, etc.) signals typically require both an analog circuit or multiple analog ICs along with the less costly digital IC devices.

Some (pseudo-analog) devices have been proposed for CMOS and BiCMOS devices. However pseudo-analog devices do not permit low power compressed designs therefore defeating the advantages present in a single chip MOS solution.

One of the substantial difficulties present in developing mixed signal circuits on MOS technology is the fabrication of passive components (resistors, capacitors, inductors, etc).

One of the challenging tasks faced by mixed signal designs, is providing a single chip solution. One limiting factor is to fabricate accurate passive components on-chip.

Various techniques are used to implement passive components in the monolithic Integrated circuits.

On-chip resistors typically are fabricated by base diffusion, emitter diffusion, ion-implantation or by thin-film deposition. In the MOS technology, the popular resistor implementations being diffused or polysilicon or well resistors or thin-film deposition or MOS devices themselves used as resistors. The resistor value that can be achieved by the above mentioned means can normally vary from 50 ohms to 50 Ohms, which is technology and process dependent.

On-chip capacitors typically are fabricated by poly-poly, poly-metal, metal-metal process or using MOS transistor capacitance and junction capacitance. Normally an extra layer of poly layer is added to provide efficient capacitor structure.

On-chip inductance typically is realized by synthesizing an inductive reactance with an active circuit. Passive inductance can be implemented on-chip using transmission lines. They are superior as they introduce less noise, consume less power, and have a wider bandwidth and linear operating range.

The crucial parameters to be considered for passive components are their tolerance, voltage coefficient and temperature coefficient. Each technique has its pros and cons, but none of them tend to result in accurate values. For example, a common technique 100 used for correcting the value of passive components which are resistors is by laser trimming as is shown in FIG. 1. In this figure, a resistor 102 extends between two terminals labeled "A" and "B" on an integrated circuit (IC) chip. Conductive lines 104 and 106 extend from the terminals "A" and "B" to other circuitry (not shown) on the IC chip 102. The resistor 102 is essentially a thin layer of resistive (partially conductive) material extending from the one terminal "A" to the other terminal "B", and is typically in the form of a rectangle, as shown, having a length (between the terminals) and a width transverse to the length.

To trim (adjust) the resistance value of the resistor 102, its resistance is measured, then the physical structure of the resistor 102 is altered by a process known as laser trimming, wherein a laser beam ablates the resistor material. Large resistance value corrections can be made by directing a laser beam (not shown) into the resistor material from a side thereof, partially across the width of the resistor, then along the length of the resistor, as indicated by the L-shaped notch 110. Smaller resistance value corrections can be made by directing the laser beam (not shown) into the resistor material from a side thereof and partially across the width of the resistor as indicated by the notch 112.

A drawback to the laser trimming technique is that it is not feasible for CMOS mass production devices. Also, it is of limited value in establishing a desired capacitance value for a capacitor or a desired inductance value for an inductor.

GLOSSARY

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used in the description contained herein:

A/D: Analog-to-Digital (converter).
ALU: Arithmetic Logic Unit.
ASIC: Application-Specific Integrated Circuit.
ATM: Asynchronous Transfer Mode
bit: binary digit.
BLP: Board-Level Product.
byte: eight contiguous bits.
C: a programming language.
CAM: Content-Addressable Memory.
CAS: Column Address Strobe.
CCD: Charge-coupled device.
CD: Compact Disc.
CISC: Complex Instruction Set Computer (or Chip).
CMOS: Complementary Metal-Oxide Semiconductor.
CODEC: Encoder/De-Coder. In hardware, a combination of A/D and D/A converters. In software, an algorithm pair.
Core: A functional block intended to be embedded and integrated in broader logic design.
CPU: Central Processing Unit.
D/A: Digital-to-Analog (converter).
DAT: Digital Audio Tape.
DBS: Direct Broadcast Satellite.
DMA: Direct Memory Access.
DRAM: Dynamic Random Access Memory.
DSP: Digital Signal Processing (or Processor).
ECC: Error Correction Code.
EDO: Extended Data Output.
EDRAM: Extended DRAM.
EEPROM: Also E2PROM. An electrically-erasable EPROM.
EPROM: Erasable Programmable Read-Only Memory.
Flash: Also known as Flash ROM. A form of EPROM based upon conventional UV EPROM technology but which is provided with a mechanism for electrically pre-charging selected sections of the capacitive storage array, thereby effectively "erasing" all capacitive storage cells to a known state.
FPGA: Field-Programmable Gate Array
G: or (Giga), 1,000,000,000.

Gbyte: Gigabyte(s).
GPIO: General Purpose Input/Output.
HDL: Hardware Description Language.
HDTV: High Definition Television
IC: Integrated Circuit.
I/F: Interface.
I/O: Input/Output.
IEEE: Institute of Electrical and Electronics Engineers
JPEG: Joint Photographic Experts Group
K: (or kilo), 1000.
kernel: a core functionality of an operating (or other software) system.
KRz: KiloHertz (1,000 cycles per second).
LAN: Local Area Network
M: (or mega), 1,000,000
MAC: Media Access Control.
Mask ROM: A form of ROM where the information pattern is "masked" onto memory at the time of manufacture.
MCM: Multi-Chip Module.
Mb Megabyte
memory: hardware that stores information (data).
MHz: MegaHertz (1,000,000 cycles per second).
MIPS: Million Instructions Per Second
MLT: Multi-Level Technology.
MPEG: Motion Picture Experts Group. Standard for encoding moving images. Also widely used for high quality audio compression.
MPU: Micro Processing Unit.
NVRAM: Non-volatile RAM.
PLL: Phase Locked Loop.
PROM: Programmable Read-Only Memory.
PWM: Pulse Width Modulation.
PLD: Programmable Logic Device.
RAS: Row Address Strobe.
RAM: Random-Access Memory.
RISC: Reduced Instruction Set Computer (or Chip).
ROM: Read-Only Memory.
RTOS: Real Time Operation System
SCM: Single Chip Module
SDRAM: Synchronous DRAM.
SIE: Serial Interface Engine.
SOC: System On a chip software: Instructions for a computer or CPU.
SRAM: Static Random Access Memory.
TCP/IP: Terminal Control Protocol/internet Protocol.
UART: Universal Asynchronous Receiver/Transmitter.
USB: Universal Serial Bus.
TV EPROM: An EPROM. Data stored therein can be erased by exposure to Ultraviolet (UV) light.
VCR: Video Cassette Recorder.
VHDL: VHSIC (Very High Speed Integrated Circuit) HDL.
WAN: Wide Area Network. Such as the telephone system or the Internet, or a satellite network.
ZISC: Zero Instruction Set Computer (or Chip).

BRIEF DESCRIPTION (SUMMARY) OF THE INVENTION

An object of the present invention is to provide an improved technique for adjusting the value of passive components on an integrated circuit (IC) chip.

Another object of the invention is to provide a technique for programmably and/or dynamically setting values for passive components on an MOS IC device.

Another object of the invention is to provide a technique for field-trimming (versus factory-trimming) the value of on-chip passive components.

Another object of the invention is to provide a technique for changing the value of on-chip passive components in situ and/or in response to dynamic changes which are desired during the operation of the IC chip.

Another object of the invention is to provide a technique for implementing true mixed signal designs on an IC chip utilizing MOS (including CMOS) technology.

According to the invention, a programmable passive component value is formed between two terminals of an integrated circuit (IC) chip. The programmable passive component value is achieved by forming a first passive component value, such as with one or more resistors, capacitors or inductors on the IC chip, and at least one additional passive component on the IC chip. Switching means are provided for selectively connecting the additional passive component (s) in series and/or in parallel with the first passive component value to achieve the desired programmable passive component value.

In an embodiment of the invention, two or more additional passive components are selectively connected by the switching means in parallel with one another, then in series with the first passive component. A second switching means may be employed in this arrangement.

In another embodiment of the invention, the two or more additional passive components are selectively switched in parallel with the first electronic component.

According to an aspect of the invention, the first and second switching means may be programmable matrix circuits (PMCs). PMCs are known switching devices commonly finding use in field programmable gate arrays (FPGAs) to effect routing of signals.

An advantage of implementing programmable-value on-chip passive components on an integrated circuit (IC) chip is that dynamic changes can be made during the operation of the IC chip, such as in response to signals generated off-chip by an external instrumentality such as a microcontroller.

An integrated circuit (IC) employing the techniques of the present invention may be included in a system or subsystem having electrical functionality. Exemplary systems and subsystems that would benefit from the techniques disclosed herein may include general purpose computers and processors;

communications and telecommunications devices (e.g., phones, faxes, etc.); networks; consumer devices; audio and visual (video) receiving, recording and display devices; transportation systems (e.g., vehicles); electromechanical devices, smart cards, etc.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments.

Certain elements in selected ones of the drawings may be illustrated not-to-scale, for illustrative clarity.

Often, similar elements throughout the drawings may be referred to by similar references numerals. For example, the element 199 in a figure (or embodiment) may be similar in many respects to the element 299 in an other figure (or embodiment). Such a relationship, if any, between similar elements in different figures or embodiments will become apparent throughout the specification, including, if applicable, in the claims and abstract.

In some cases, similar elements may be referred to with similar numbers in a single drawing. For example, a plurality of elements 199 may be referred to as 199a, 199b, 199c, etc.

The cross-sectional views, if any, presented herein may be in the form of "slices", or "near-sighted" cross-sectional views, omitting certain background lines which would otherwise be visible in a true cross-sectional view, for illustrative clarity.

Figure 1:
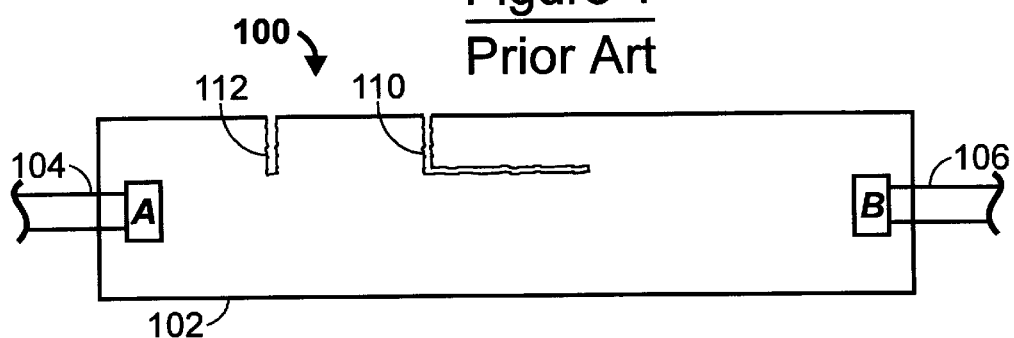
Figure 2A:
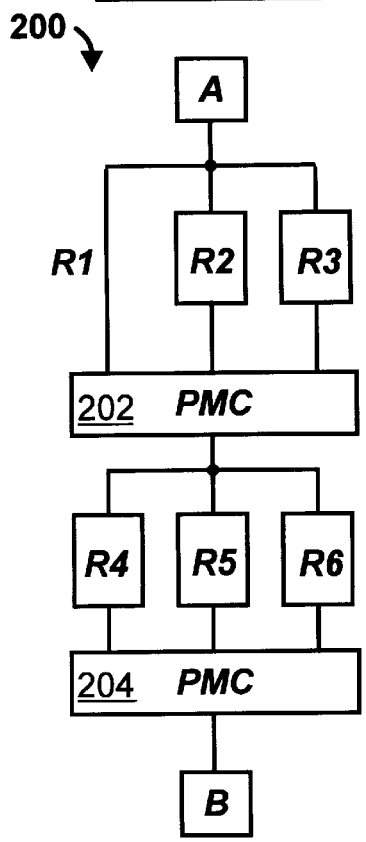
Figure 2B:
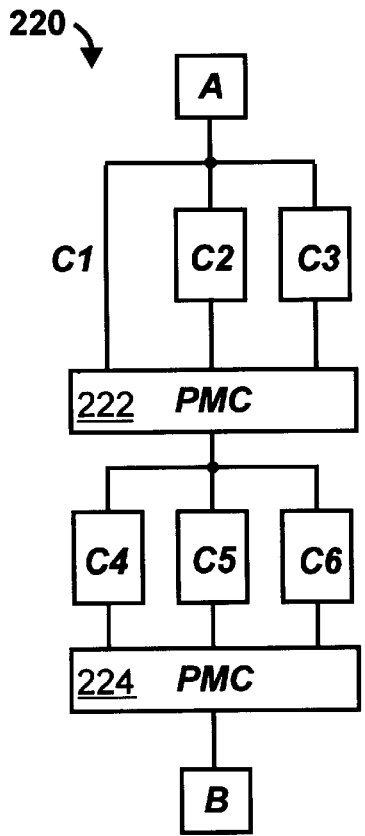
Figure 2C:
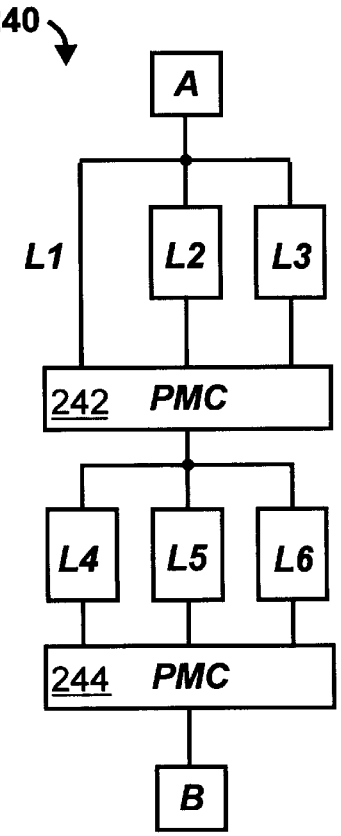
Figure 5:
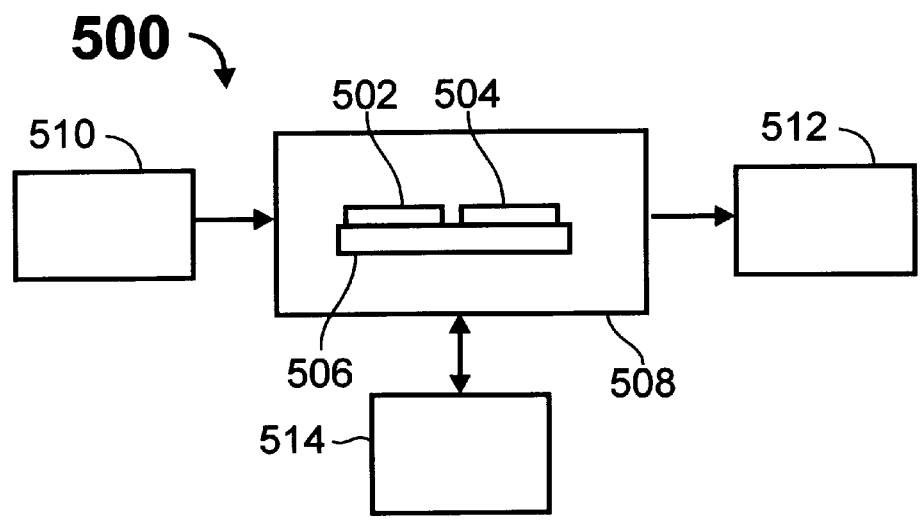
Figure 5A:
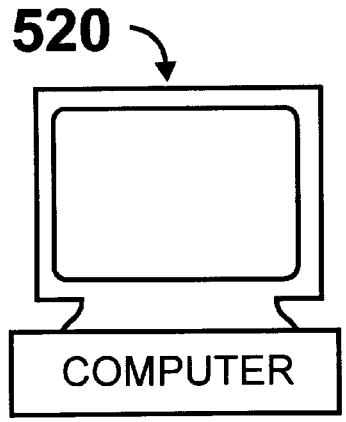
Figure 5B:
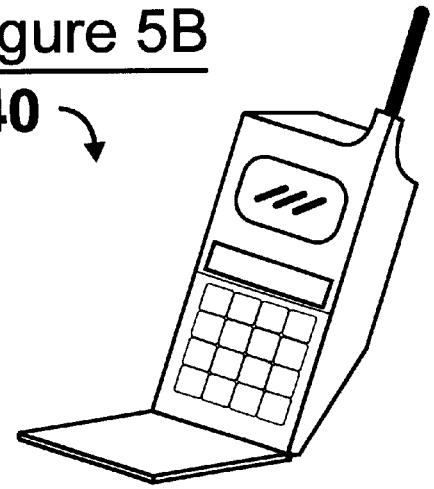
Figure 6:
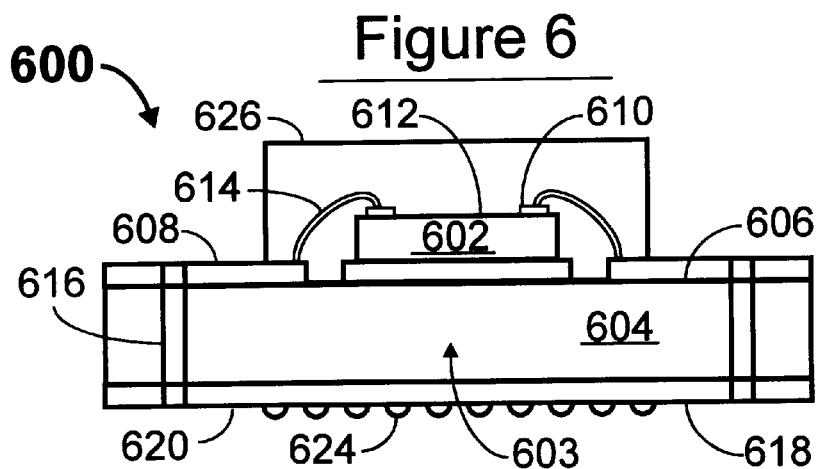
Figure 7:
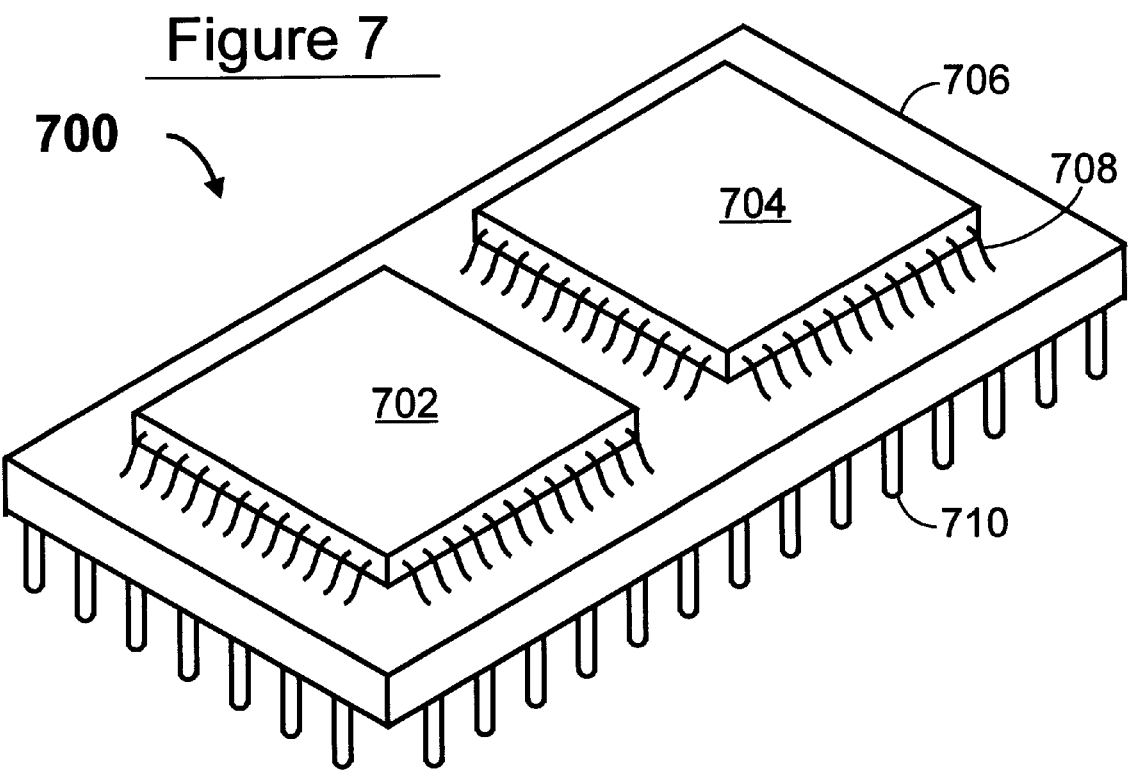
Figure 8:
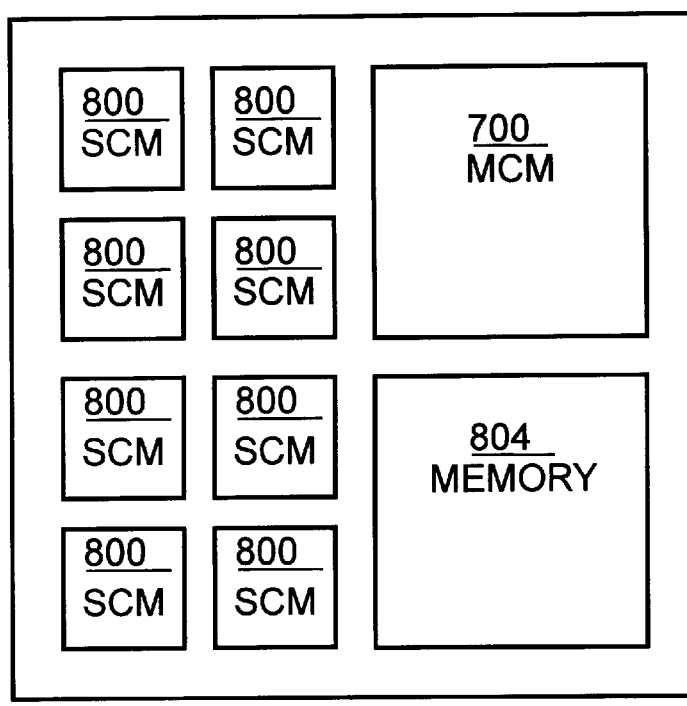
Figure 9:
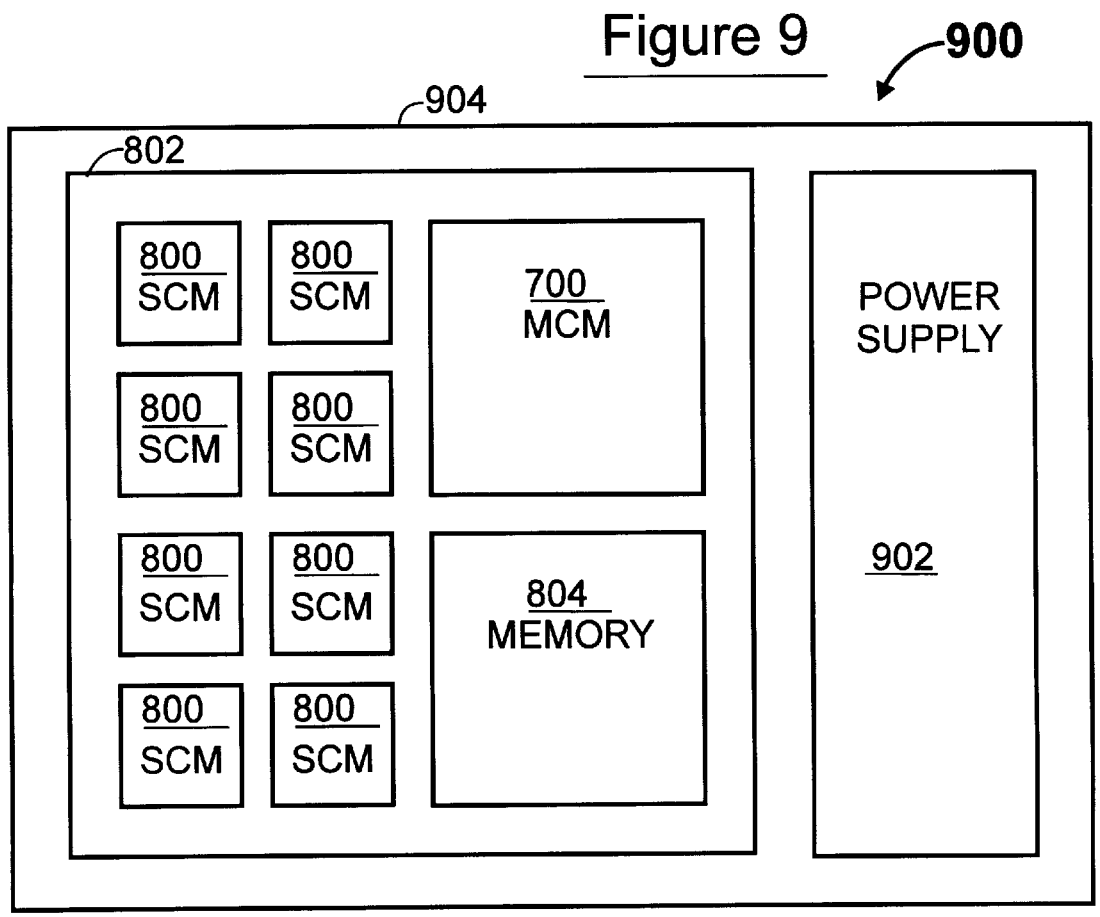
Figure 10:
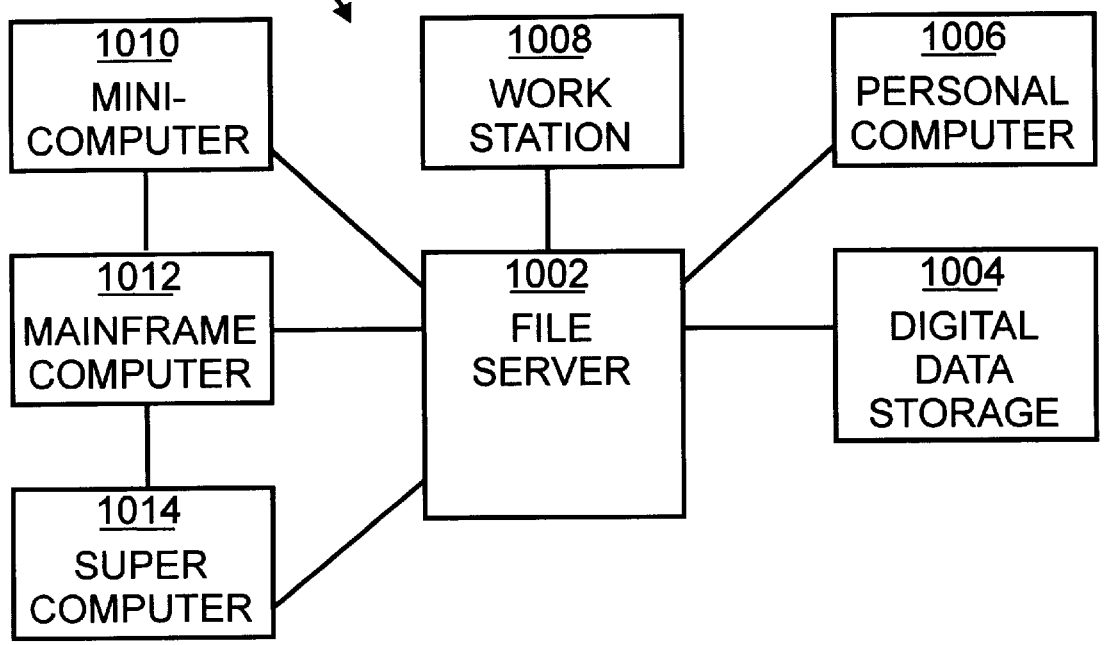
Figure 11:
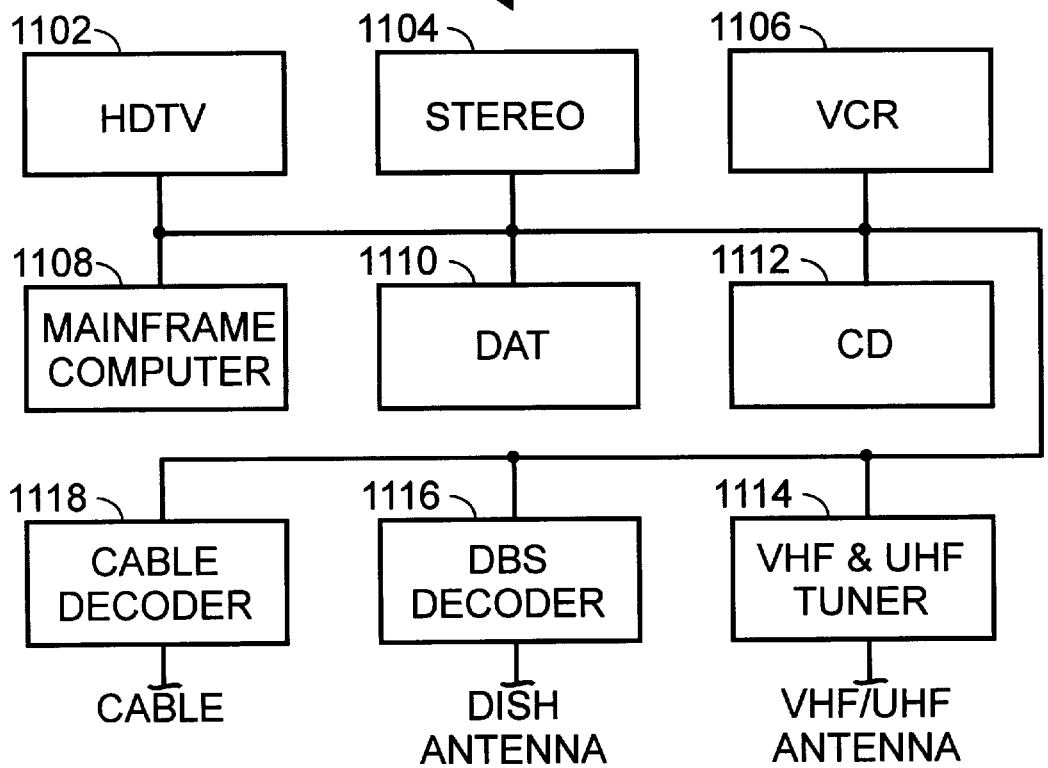
Figure 12:
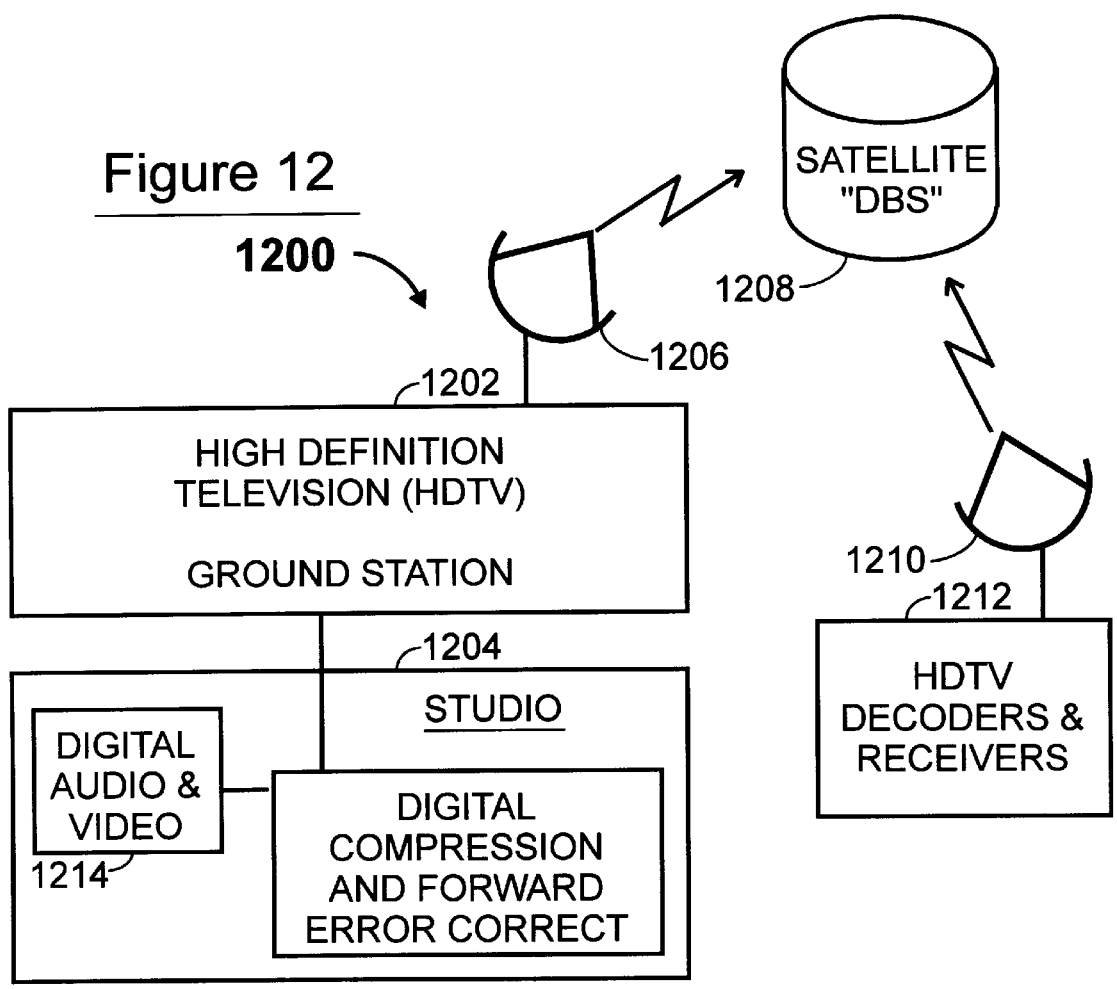
Figure 13:
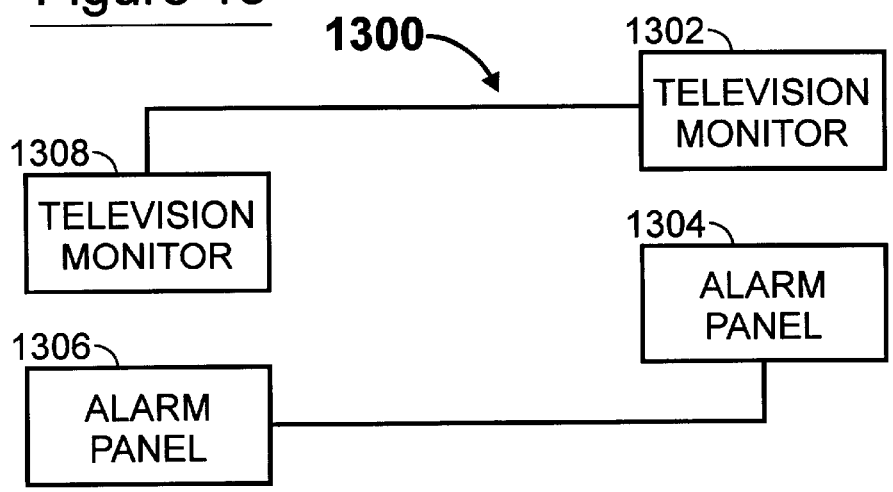
Figure 14:
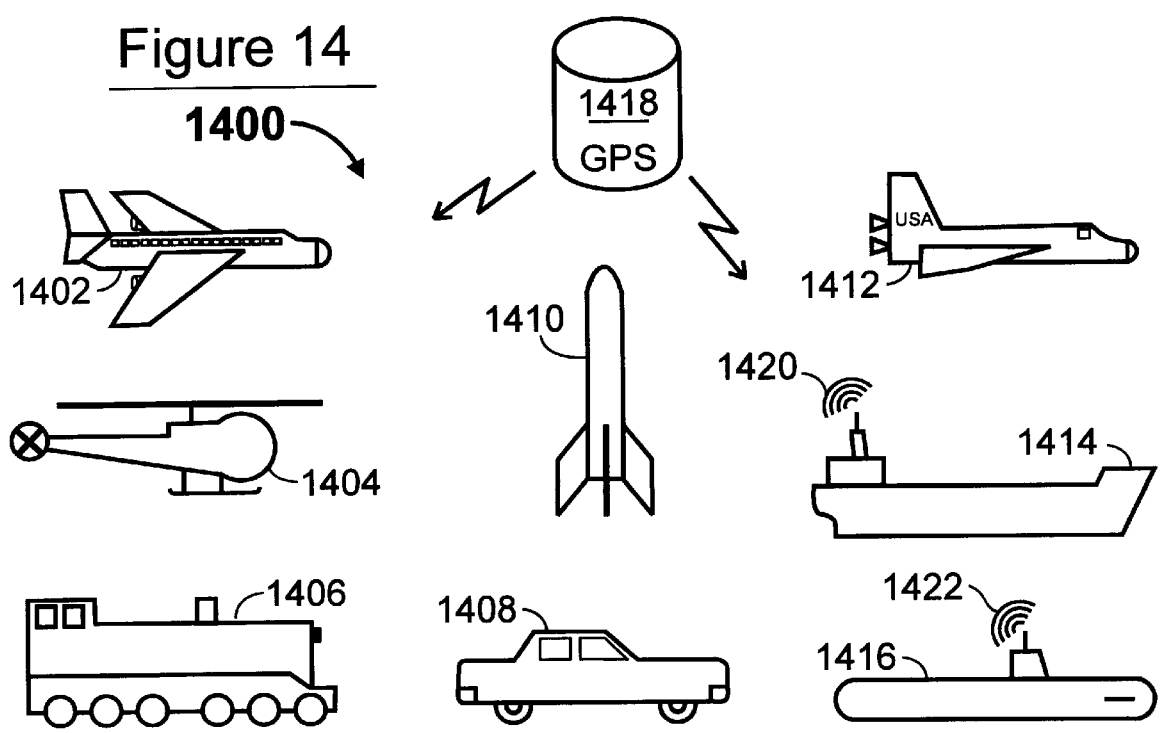
Figure 15:
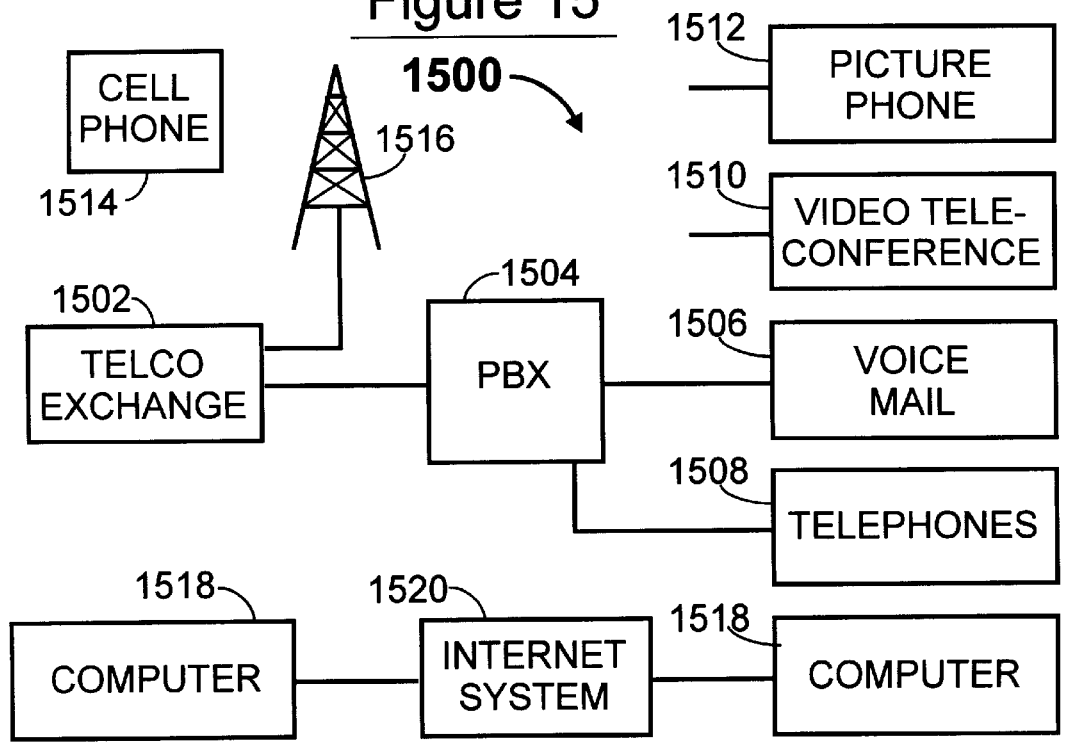

The structure, operation, and advantages of the present preferred embodiment of the invention will become further apparent upon consideration of the following description taken in conjunction with the accompanying drawings, wherein:

FIG. 1 is a top plan view of a resistor, illustrating a value-trimming technique of the prior art;

FIG. 2A is a block diagram of a circuit comprising a plurality of passive components which are resistors formed on an IC chip (not shown, well known), according to the invention;

FIG. 2B is a block diagram of a circuit comprising a plurality of passive components which are capacitors formed on an IC chip (not shown, well known), according to the invention;

FIG. 2C is a block diagram of a circuit comprising a plurality of passive components which are capacitors formed on an IC chip (not shown, well known), according to the invention;

FIG. 3 is a block diagram of an alternate embodiment of a circuit comprising a plurality of passive components which may be resistors, capacitors or inductors formed on an IC chip (not shown, well known), according to the invention;

FIG. 4 is a block diagram of an alternate embodiment of a circuit comprising a plurality of passive components which may be resistors, capacitors or inductors formed on an IC chip (not shown, well known), according to the invention;

FIG. 5 is a schematic block diagram of a system incorporating the technique(s) of the present invention;

FIG. 5A is an illustration of a general purpose computer incorporating the technique(s) of the present invention;

FIG. 5B is an illustration of a wireless telephone (cell phone) incorporating the technique(s) of the present invention;

FIG. 6 is a schematic elevational view of a single chip module illustrated in cross section;

FIG. 7 is a schematic perspective view of a multi-chip module;

FIG. 8 is a schematic top view of a board level product;

FIG. 9 is a schematic top view of a box level product;

FIG. 10 a schematic block diagram of a computer system;

FIG. 11 a schematic block diagram of an entertainment system;

FIG. 12 is a schematic block diagram of an information and entertainment transmission system;

FIG. 13 is a schematic block diagram of a security and surveillance system;

FIG. 14 is a schematic block diagram of a plurality of transportation systems; and FIG. 15 is a schematic block diagram of a plurality of communications and information transmission systems.

DETAILED DESCRIPTION OF THE INVENTION

The present invention advantageously utilizes well-known techniques for causing connections to selectively be made in integrated circuit (IC) chips, such as with programmable matrix circuitry (PMC), and is comparable to causing switch closures to be made on the IC chip in response to signals provided to the IC chip. A programmable matrix circuit may be implemented using static or anti-fuse SRAM-based techniques, or dynamically using SRAM or microprocessor or other means.

The present invention advantageously utilizes the following well known characteristics of passive components (resistors, capacitors, inductors) when they are connected together, in series or parallel, with one another.

When two or more resistors ($R_1$, $R_2$, $R_3$, etc.) are connected in series with one another, the total resistance $R_{TOTAL}$ is the sum of the individual resistances, and can be determined as follows:

$$R_{TOTAL}=R_1+R_2+R_3+*\ldots$$

In a circuit with resistors connected in parallel with one another, the total resistance $R_{TOTAL}$ is less than that of the lowest value individual resistor, and can be determined as follows:

$$R_{TOTAL}=1(1/R_1+1/R_2+1/R_3+\ldots$$

A special case is two resistors in parallel with one another, in which case the resulting total resistance is the product divided by the sum of the two resistances (which can be derived from the formula set forth immediately above).

When two or more capacitors ($C_1$, $C_2$, $C_3$, etc.,) are connected in parallel with one another, the total capacitance $C_{TOTAL}$ is the sum of the individual capacitances, and can be determined as follows:

$$C_{TOTAL}=C_1+C_2+C_3+\ldots$$

When two or more capacitors are connected in series with one another, the total capacitance $C_{TOTAL}$ is less than that of the smallest value individual capacitor in the group, and can be determined as follows:

$$C_{TOTAL}=1(1/C_1+1/C_2+1/C_3+\ldots)$$

A special case is two capacitors in series with one another, in which case the resulting total capacitance is the product divided by the sum of the two capacitances (which can be derived from the formula set forth immediately above).

When two or more inductors ($L_1$, $L_2$, $L_3$, etc.) are connected in series with one another, the total inductance $L_{TOTAL}$ is the sum of the individual inductances (setting aside effects of mutual inductance which may be caused by overlapping magnetic fields, and can be determined as follows:

$$L_{TOTAL}=L_1+L_2+L_3+\ldots$$

In a circuit with inductors connected in parallel with one another, the total inductance $L_{TOTAL}$ is less than that of the lowest value individual inductor (again, setting aside effects of mutual inductance), and can be determined as follows:

$$L_{TOTAL}=1(1/L_1+1/L_2+1/L_3+\ldots)$$

A special case is two inductors in parallel with one another, in which case the resulting total inductance is the product divided by the sum of the two inductances (which can be derived from the formula set forth immediately above).

Programmable Resistances

FIG. 2A illustrates an arrangement (network) 200 of passive components which are resistors formed on an IC chip (not shown, well known) and connected between two terminals "A" and "B" of the IC chip, the overall object of which is to provide a technique for establishing (tailoring) an overall resistance value between the terminals "A" and "B", such as may be a critical parameter of an overall circuit (not shown) which is implemented on the IC chip.

Three resistors $R_1$, $R_2$ and $R_3$ are selectively connected between the terminal "A" and a first switching means 202 such as a programmable matrix circuit (PMC). In this example, the resistor $R_1$ has a value of 0 ohms. Depending on the state of the switching means 202, one or more of the three resistors $R_1$, $R_2$ and $R_3$ are connected, in parallel with one another, between the terminal "A" and the first switching means 202, resulting in there being a "first" resistance value "$R_P$" between the terminal "A" and the first switching means 202 which can be calculated according to the known formula (set forth hereinabove) for resistors connected in parallel with one another.

Three additional resistors $R_4$, $R_5$, $R_6$ are shown, each connected at one end to the first switching means 202, and each connected at another end to a second switching means 204 which may also be a programmable matrix circuit (PMC). The second switching means 204 is suitably connected directly to the terminal "B". In this manner, one or more of the additional resistors $R_4$, $R_5$, $R_6$ can be switched into series with the first resistance value $R_P$ to effect an overall total resistance value $R_{TOTAL}$ between the terminals "A" and "B", as follows.

The total resistance $R_{TOTAL}$ between the terminals "A" and "B" will be the sum of the first resistance value $R_P$ plus the resistance of the one or more additional, parallel-connected (if two or more of the additional resistors are caused to be connected) resistors $R_4$, $R_5$, $R_6$.

For example, in the case of only a one of the three additional resistors being connected in series (via the PMCs 202 and 204) with the first resistance value $R_P$, for example only the additional resistor $R_4$, the total resistance $R_{TOTAL}$ between the terminals "A" and "B" would be as follows:

$$R_{TOTAL}=R_P+R_4$$

For example, in the case of only two of the three additional resistors being connected in series (via the PMCs 202 and 204) with the first resistance value $R_P$, for example only the additional resistors $R_4$ and $R_5$, the total resistance $R_{TOTAL}$ between the terminals "A" and "B" would be as follows:

$$R_{TOTAL}R_P+1/(1/R_4+1/R_5)$$

For example, in the case of all three of the additional resistors $R_4$, $R_5$, $R_6$ being connected in series (via the PMCs 202 and 204) with the first resistance value $R_P$, the total resistance $R_{TOTAL}$ between the terminals "A" and "B" would be as follows:

$$R_{TOTAL}=R_P+1/(1/R_4+1/R_5+1/R_6)$$

In this manner, processes such as laser trimming are avoided, and a facile technique is provided for establishing a desired relatively precise adjustable resistance value between two terminals of an integrated circuit (IC) chip with two or more passive components (in this case, one or more first resistors and one or more additional resistors). In general terms, by switching in any of the additional resistors $R_4$, $R_5$ or $R_6$, the total resistance $R_{TOTAL}$ will be greater than the first resistance value $R_P$. The values selected would, of course, depend entirely upon the intended function of the resistance between the terminals "A" and "B".

Programmable Capacitances

FIG. 2B illustrates an arrangement (network) 220 of passive components which are capacitors formed on an IC chip (not shown, well known) and connected between two terminals "A" and "B" of the IC chip, the overall object of which is to provide a technique for establishing (tailoring) an overall capacitance value between the terminals "A" and "B", such as may be a critical parameter of an overall circuit (not shown) which is implemented on the IC chip.

Three capacitors $C_1$, $C_2$ and $C_3$ are selectively connected between the terminal "A" and a first switching means 222 such as a programmable matrix circuit (PMC). In this example, the capacitor $C_1$ has a value of 0 picofarads (pf). Depending on the state of the switching means 222, one or more of the three capacitors $C_1$, $C_2$ and $C_3$ are connected, in parallel with one another, between the terminal "A" and the first switching means 222, resulting in there being a "first" capacitance value "$C_P$" between the terminal "A" and the first switching means 222 which can be calculated according to the known formula (set forth hereinabove) for capacitors connected in parallel with one another.

Three additional capacitors $C_4$, $C_5$, $C_6$ are shown, each connected at one end to the first switching means 222, and each connected at another end to a second switching means 224 which may also be a programmable matrix circuit (PMC). The second switching means 224 is suitably connected directly to the terminal "B". In this manner, one or more of the additional capacitors $C_4$, $C_5$, $C_6$ can be switched into series with the first capacitance value $C_P$ to effect an overall total capacitance value $C_{TOTAL}$ between the terminals "A" and "B", as follows.

The total capacitance $C_{TOTAL}$ between the terminals "A" and "B" will be the product over (divided by) the sum of a quantity which is the aggregate capacitance value for however many of the one or more additional capacitors $C_4$, $C_5$, $C_6$ are connected in parallel with one another (e.g., the sum of $C_4C_5+C_6$) and the first capacitance value $C_P$.

In this manner, a facile technique is provided for establishing a desired relatively precise adjustable capacitance value between two terminals of an integrated circuit (IC) chip with two or more passive components (in this case, one or more first capacitors and one or more additional capacitors). In general terms, by switching in any of the additional capacitors $C_4$, $C_5$ or $C_6$, the total capacitance $C_{TOTAL}$ will be less than the first capacitance value $C_P$. The values selected would, of course, depend entirely upon the intended function of the capacitance between the terminals "A" and "B".

Programmable Inductances

FIG. 2C illustrates an arrangement (network) 200 of passive components which are inductors formed on an IC chip (not shown, well known) and connected between two terminals "A" and "B" of the IC chip, the overall object of which is to provide a technique for establishing (tailoring) an overall inductance value between the terminals "A" and "B", such as may be a critical parameter of an overall circuit (not shown) which is implemented on the IC chip.

Three inductors $L_1$, $L_2$ and $L_3$ are selectively connected between the terminal "A" and a first switching means 242 such as a programmable matrix circuit (PMC). In this example, the inductor $L_1$ has a value of 0 microHenries (μH). Depending on the state of the switching means 242, one or more of the three inductors $L_1$, $L_2$ and $L_3$ are connected, in parallel with one another, between the terminal "A" and the first switching means 242, resulting in there being a "first" inductance value "$L_P$" between the terminal "A" and the first switching means 242 which can be calculated according to the known formula (set forth hereinabove) for inductors connected in parallel with one another.

Three additional inductors $L_4$, $L_5$, $L_6$ are shown, each connected at one end to the first switching means 242, and each connected at another end to a second switching means 244 which may also be a programmable matrix circuit (PMC). The second switching means 244 is suitably connected directly to the terminal "B". In this manner, one or more of the additional inductors $L_4$, $L_5$, $L_6$ can be switched into series with the first inductance value $L_P$ to effect an overall total inductance value $L_{TOTAL}$ between the terminals "A" and "B", as follows.

The total inductance $L_{TOTAL}$ between the terminals "A" and "B" will be the sum of the first inductance value $L_P$ plus the inductance of the one or more additional, parallel-connected (if two or more of the additional inductors are caused to be connected) inductors $L_4$, $L_5$, $L_6$.

For example, in the case of only a one of the three additional inductors being connected in series (via the PMCs 242 and 244) with the first inductance value $L_P$, for example only the additional inductor $L_4$, the total inductance $L_{TOTAL}$ between the terminals "A" and "B" would be as follows:

$$L_{TOTAL} = L_P + L_4$$

For example, in the case of only two of the three additional inductors being connected in series (via the PMCs 242 and 244) with the first inductance value $L_P$, for example only the additional inductors $L_4$ and $L_5$, the total inductance $L_{TOTAL}$ between the terminals "A" and "B" would be as follows:

$$L_{TOTAL} = L_P + 1/(1/L_4 + 1/L_5)$$

For example, in the case of all three of the additional inductors $L_4$, $L_5$, $L_6$ being connected in series (via the PMCs 242 and 244) with the first inductance value $L_P$, the total inductance $L_{TOTAL}$ between the terminals "A" and "B" would be as follows:

$$L_{TOTAL} = L_P + 1/(1/L_4 + 1/L_5 + 1/L_6)$$

In this manner a facile technique is provided for establishing a desired relatively precise adjustable inductance value between two terminals of an integrated circuit (IC) chip with two or more passive components (in this case, one or more first inductors and one or more additional inductors). In general terms, by switching in any of the additional inductors $L_4$, $L_5$ or $L_6$, the total inductance $L_{TOTAL}$ will be greater than the first inductance value $L_P$. The values selected would, of course, depend entirely upon the intended function of the inductance between the terminals "A" and "B".

Alternate Embodiments of the Invention

There have thus been described in FIGS. 2A, 2B and 2C preferred circuit arrangements for establishing a desired resistance, capacitance or inductance value between two terminals of an integrated circuit (IC) chip. Although each of these circuit arrangements were described with respect to a single type of passive component, it is within the scope of this invention that more than one type of passive component can be switched into a circuit between two terminals of an IC chip using the techniques described either hereinabove or hereinbelow.

In the embodiments described hereinabove with respect to FIGS. 2A, 2B and 2C, one or more additional passive components were switched into parallel with one another, and into series with one or more first passive components, and two switching means were employed. The embodiments described hereinbelow with respect to FIGS. 3 and 4 are variations thereof.

FIG. 3 illustrates an arrangement (network) 300 of passive components ("P") which are any of resistors, capacitors and inductors formed on an IC chip (not shown, well known) and connected between two terminals "A" and "B" of the IC chip, the overall object of which is to provide a technique for establishing (tailoring) an overall passive component value between the terminals "A" and "B", such as may be a critical parameter of an overall circuit (not shown) which is implemented on the IC chip.

In this embodiment, rather than using two switching means (e.g., 202, 204), a single switching means 302 is employed. The switching means 302 is any suitable semiconductor switches that can be selectively turned on, as is known in the art. The first passive component $P_1$ is connected between the terminal "A" and the switching means 302. The one or more additional passive components $P_2$, $P_3$ and $P_4$ are connected between the terminal "B" and the switching means 302. In this manner, one or more of the additional passive components $P_2$, $P_3$ and $P_4$ can be connected in parallel with one another and, in aggregate, in series with the first passive component $P_1$ As illustrated, in this example the switches corresponding to the additional passive components $P_2$ and $P_4$ are shown closed, and the switch corresponding to the passive component $P_3$ is shown open.

FIG. 4 illustrates an arrangement (network) 400 of passive components ("P") which are any of capacitors, capacitors and inductors formed on an IC chip (not shown, well known) and connected between two terminals "A" and "B" of the IC chip, the overall object of which is to provide a technique for establishing (tailoring) an overall passive component value between the terminals "A" and "B", such as may be a critical parameter of an overall circuit (not shown) which is implemented on the IC chip.

In this embodiment, rather than using two switching means (e.g., 202, 204), a single switching means 402 (compare 302) is employed. The switching means 402 is any suitable semiconductor switches that can be selectively turned on, as is known in the art. Also, rather than connecting the additional passive components $P_2$, $P_3$, $P_4$ in series with the first passive component $P_1$, they are selectively connected in parallel with the first passive component. In this example, the first passive component $P_1$ is permanently connected between the terminal "A" and the terminal "B". The one or more additional passive components $P_2$, $P_3$ and $P_4$ are connected between the terminal "B" and the switching means 302, then to the terminal "A". In this manner, one or more of the additional passive components $P_2$, $P_3$ and $P_4$ can be connected in parallel with one another and, in aggregate, in parallel with the first passive component $P_1$. As illustrated, in this example the switches corresponding to the additional passive components $P_2$ and $P_3$ are shown closed, and the switch corresponding to the passive component $P_4$ is shown open.

The switching means 302 and 402 described with respect to FIGS. 3 and 4 are readily implemented using hard-wired or SRAM-based switches.

Although the foregoing detailed description has primarily been directed to exemplary preferred embodiments of the present invention, it should be understood that this has been done by way of example only and not by way of limitation.

System Integration

It is clearly contemplated that the technique(s) of the present invention, as disclosed hereinabove, can be integrated with other electronic components and subsystems to realize a subsystem or a system having electrical functionality such as, but not limited to: general-purpose computers; telecommunication on devices (e.g., phones, faxes, etc); networks; consumer devices; audio and visual (video) receiving, recording and display devices and systems; and vehicles such as planes, trains and automobiles.

FIG. 5 illustrates an example of such an overall system 500. As shown therein, an electronic component 502 incorporating the technique(s) of the present invention can be connected, along with at least one other electronic component 504, on an interconnection substrate (e.g., motherboard) 506, thereby forming a subsystem 508, to which a number of peripheral (e.g., external) devices may be connected. Exemplary peripheral devices may include:

one or more devices 510 for providing inputs to the subsystem 508, such as keyboards, pointing devices, digitizing tablets, and the like;

one or more devices 512 for receiving outputs from the subsystem 508, such as video monitors, and the like; and one or more devices 514 for engaging in two-way communications with the subsystem 508, such as modems, printers, and the like.

It is clearly within the purview of a person having ordinary skill in the art to which the present invention most nearly pertains to effect such system integration, based on the descriptions set forth hereinabove.

FIG. 5A illustrates, for example, a general purpose computer 520 (compare 500) incorporating the present invention.

FIG. 5B illustrates, for example, a wireless telephone 540 (compare 500) incorporating the present invention.

Many other combinations of features, some of which have been expressly set forth hereinabove, are within the spirit and scope of this invention and may be advantageously utilized in SCM, MCM, and BLP systems as contemplated herein.

System level products may be designed and fabricated in various forms. A system level product may, for example, include a single chip modules ("SCM") having a single semiconductor die in a single package body, with or without other electrical components, such as capacitors. System level products may also include multi-chip modules ("MCM") having two or more semiconductor dies in the same or separate package bodies, with or without other electrical components. System level products may also include board level products ("BLP"), such as those having one or more semiconductor devices on one or more printed wiring boards. Box level products ("Boxes") are also system level products which may include a combination of SCMs, MCMs, BLPs, and/or other devices. One or more of such SCMs, MCMs, BLPs or Boxes may act as, or be integrated into, a functional system or subsystem or the like.

System level products can be employed to carry out numerous applications and in various environments. For example, system level products may include:

(a) computer systems comprising personal computers, work stations, servers, embedded logic controllers, digital data storage, minicomputers, mainframe computers and super computers;

(b) information and entertainment transmission systems comprising telecommunications, satellite, cable, cellular telephones, private branch exchange, telephone switching, and video picture telephones wherein the information may be digitally compressed and forward error corrected;

(c) entertainment systems comprising digital video and audio systems, such as digital analog tape and high definition television, playback devices, display and reproduction means, for example, televisions, cameras, recorders, compact disc players/recorders, digital tape players/recorders and the like;

(d) security and surveillance systems comprising home and business security intrusion, flood and fire systems; vehicle alarms;

(e) information, data acquisition and control systems comprising industrial plant sensors and control means, and control systems utilizing information from the sensors to actuate the control means; and (f) transportation systems comprising airplanes, trains, automobiles, helicopters, rockets, missiles, boats and submarines, and the like, as well as subsystems utilized in the transportation systems, which include positioning systems (for example, global positioning systems), navigational displays and controllers, hazard avoidance systems (such as radar and sonar), fly by wire control systems and engine controlling and monitoring systems.

The above mentioned systems may also be combined to comprise larger and more complex systems that can be utilized to facilitate the infrastructure of a home, business, municipality, government entity, city wide community, state governance, world wide communications, information distribution and security.

In an SCM, a single semiconductor die is packaged and adapted for connection to external systems. This usually involves mounting the die to some sort of substrate, lead frame or carrier, connecting the bond pads on the die to some sort of conductive leads or traces and forming a package body around the die. The conductive leads or traces exit the package body, and usually terminate in external leads, pins or solder balls.

Referring to FIG. 6, a schematic elevational view of a SCM is illustrated in cross section. The SCM 600, as illustrated, is a ball bump grid array semiconductor package. A semiconductor die 602 is mounted to the top surface of a central area 603 of a substrate 604. The semiconductor die has conductive lines 612 formed thereon (not illustrated). The top surface 606 of the substrate 604 is provided with a number of conductive traces 608 that extend from near the periphery of the substrate 604 to the central area 603. The die 602 has bond pads 610 thereon. Bond wires 614 extend from the bond pads 610 to inner ends of the traces 608. Near the periphery of the substrate 604, there are plated (conductive) through-holes (vias) 616 extending from the bottom surface 618 of the substrate 604, through the substrate to a respective trace 608. The bottom surface 618 of the substrate is provided with a number of conductive traces 620, each having an end connected with a respective via 616. In this manner, signals (and power) to and from the die are connected through the bond wires 614, through the top side traces 608, through the vias 616, to the bottom side traces 620. Solder balls 624 are attached to the traces 620. A package body 626 is formed over the die 602, and partially covers the top surface of the substrate 604.

Pin grid array semiconductor packages, chip carriers (leaded or leadless), flat packs (such as plastic quad gullwing flat packs), ceramic packages and small outline integrated circuits are also examples of SCMs. Numerous other examples, designs and types of SCMs are known to those of ordinary skill in the art of semiconductor integrated circuit packages.

When two or more semiconductor dies are mounted in the same or separate package body, with or without other electrical components, the resulting assembly is typically referred to as a multi-chip module (MCM).

In order to connect to one of the two or more semiconductor dies of a MCM, a substrate having conductive traces (like substrate 604 of FIG. 6) is often used. Additional components such as capacitors, resistors and inductors may be mounted to the substrate. Often, the interconnections between the various components mounted to the substrate necessitate a large number of conductive traces which need to cross one another. In such cases, it is known to provide a substrate, having alternating layers of insulating material (such as fiberglass, teflon, FR4, BT resin, and the like) and conductive trace patterns (typically formed of metal foils, such as copper). The conductive traces from one layer are typically connected to the conductive traces of another layer by plated through-holes or vias.

FIG. 7 illustrates a schematic perspective view of a MCM. MCM 700 comprises a substrate 706 having conductive lines formed thereon (not illustrated), at least two semiconductor dies 702 and 704 disposed on the substrate 706 and electrically connected to conductive lines (not illustrated) of the substrate 706 by the outer tips of lead frame leads 708. The dies 702 and 704 may be physically mounted to the substrate 706. The two semiconductor dies 702 and 704 are illustrated encapsulated, however, non-encapsulated flip-chip ball bump dies are also contemplated. One or more layers of conductive traces and plated through-holes (not illustrated) may be disposed within substrate 706 and are used to connect the semiconductor dies 702 and 704 to one another and to external connections 710, such as the solder ball bump structures as described above. Additional electrical components, such as capacitors, resistors and inductors (not illustrated) may also be disposed on and connected to the substrate 706. Numerous other examples, designs and types of MCMs are known to those of skill in the art of semiconductor packages.

A BLP typically includes one or more semiconductor devices (such as a single chip module and/or a multi-chip module), in addition to other components, on one or more printed wiring boards.

FIG. 8 illustrates a schematic top view of a board level product (BLP). The BLP 800 comprises an array of SCMs 600, a MCM 700, and a memory component 704. The SCMs 600, the MCM 700, and memory 804 are each disposed on and connected to a printed wiring board 802. The printed wiring board 802 provides for all connections between those components. Examples of BLPs include central processing unit boards, memory boards, and interface boards (as are routinely utilized in computer systems).

Boxes are also system level products which may include a combination of SCMs, MCMs, BLPs, and/or other devices. For example, multiple board level products may be connected in parallel with one another by a bus (such as a back plane bus, which is also referred to as a mother board), which communicates signals therebetween. Numerous other examples, designs and types of Boxes are readily apparent to one of ordinary skill in the art. The conductive leads wires exit the boxes, and are usually terminated at external leads or pins.

FIG. 9 illustrates a schematic top view of a box level product. The box level product 900 comprises at least one printed wiring board 802 as described above, a power supply 902 and an enclosure or box 904 containing the at least one board 802 and the power supply 902. One or more box level products may be used to create more complex systems according to the present invention.

FIG. 10 illustrates a schematic block diagram 1000 of various computer systems interconnected together via various digital data transmission systems. A file server 1002 is connected to a digital data storage device 1004 such as, for example, magnetic hard disk, tape, optical disk, flash memory, core memory, semiconductor memory and the like. The server 1002 may be connected to at least one personal computer 1006, a work station 1008, a minicomputer 1010, a mainframe computer 1012, and a super computer 1014 through a number of digital data transmission system networks such as token ring, star, coaxial, fiber-optic and the like. These networks may utilize data protocols such as Scaleable Coherent Interface ("SCI"), ANSI/IEEE Std 1596-1992 SCI, Asynchronous Transfer Mode ("ATM"), FiberChannel, SerialBus, SCSI, SSA, QuickRing, HIPPI, FDDI, Ethernet and the like.

FIG. 11 is a schematic block diagram of an entertainment system according to the present invention. The entertainment system 1100 may be comprised of the following component subsystems: a high definition television (HDTV) 1102, a stereo 1104, a video cassette recorder (VCR) 1106, a television camera/recorder (Camcorder) 1108, a digital audio tape unit (DAT) 1110, a compact disk player (CD) 1112, a VHF/UHF tuner 1114, a direct broadcast satellite (DBS) decoder 1116, and a cable decoder 1118. These component subsystems are made up of SCM, MCM, BLP and boxes as disclosed above.

The DBS decoder 1116 receives a digitally encoded and forward error corrected signal from a dish antenna (not illustrated) which receives a DBS entertainment signal from a geosynchronous satellite (see FIG. 12). Hardwired cable is connected to the cable decoder 1118 which decodes and converts the cable entertainment channels to signals for viewing on the HDTV 1102 or a standard television (not illustrated). Standard broadcast television and stereo signals may be received by the VHF/UHF tuner 1114 and the base band signals made available to the HDTV 1102, stereo 1104 and the other recording devices (VCR 1106, DAT 1110). Similarly, recorded entertainment information may be played on the HDTV 1102 and stereo 1104 from the playback devices OAT 1110, Camcorder 1108, CD 1112, VCR 1106) for viewing and listening enjoyment by the user.

FIG. 12 is a schematic block diagram of an information and entertainment communications system according to the present invention. The information and entertainment communications system 1200 is comprised of the following systems: A HDTV ground station 1202 which transmits a digitally encoded and forward error corrected signal from the HDTV studio 1204 by microwave dish 1206 to a DBS satellite 1208. The satellite 1208 rebroadcasts the signal from the studio 1204 to a plurality of ground station dish antennas 1210 which are connected to corresponding HDTV receivers/decoders 1212 where the DBS satellite signal is processed and made available, for example, to the entertainment system 1100. The system 1200 is comprised of many SCM, MCM, BLP and box level subsystems which greatly benefit from the features, aspects and advantages of the present invention. Some of these subsystems are a digital audio and video formatting subsystem 1214 which convert the analog entertainment information into a digital format, and a digital compression and forward error connection subsystem 1216 which prepares the digitally encoded entertainment information for transmission by the ground station 1202 to the satellite 1208.

FIG. 13 is a schematic block diagram of a security and surveillance system according to the present invention. The security and surveillance system 1300 is comprised of the following subsystems: A television camera 1302, intrusion detection sensors 1304, a sensor alarm panel 1306, and a television monitor 1308. The television monitor 1308 displays what the television camera(s) 1302 observe. The alarm panel 1306 displays the status of the sensors 1304 and will annunciate an alert upon a sensed alarm condition. The system 1300 may be utilized in homes, businesses, government building, military bases, prisons and any area requiring security and surveillance.

In addition, another embodiment of the security and surveillance system 1300 may be utilized to monitor operating conditions of transportation systems such as engine status, hull integrity, operating temperatures, maintenance evaluation and other parameters deemed necessary for the safe and efficient operation of the transportation systems (see FIG. 15). In a further embodiment of subsystems for the transportation systems, positioning and navigational (GPS) systems may be utilized for hazard avoidance, as well as radar and sonar (see FIG. 15). Further, operation of the transportation systems may be implemented by digital control, such as "fly-by-wire", along with the monitoring thereof. The system 1300 and its subsystems may be utilized with the other system embodiments disclosed herein and will greatly benefit from the features, aspects and advantages of invention as disclosed hereinabove.

FIG. 14 is a schematic block diagram of a plurality of transportation systems according to the present invention. The transportation systems, generally referenced to by the numeral 1400, may utilize, individually or in combination, the aforementioned systems to great advantage. Embodiments of the transportation system 1400 is as follows: An airplane 1402, a helicopter 1404, a train 1406, a vehicle 1408 such as an automobile or truck, a rocket 1410, a space shuttle 1412, a ship 1414, a submarine 1416, and the like. Each of the embodiments of the transportation systems 1400 contemplated herein may greatly benefit from the communications, navigation and control systems disclosed herein along with he features, aspects and advantages of the present invention.

Each of the embodiments of the transportation systems 1400 may utilize a positioning and navigation system which derives its position information from a global positioning satellite system (GPS) 1418. The positioning and navigation system is comprised of SCM, MCM, BLP and box level systems as discussed hereinabove. Radar 1420 and/or sonar 1422 systems may be utilized for collusion avoidance and location and may be incorporated with any of the transportation systems 1400.

FIG. 15 is a schematic block diagram of a plurality of communications and information transmission systems according to the present invention. The communications and information transmission systems 1500 may comprise, individually or in combination, a telephone exchange 1502, a PBX 1504, a voice mail system 1506, telephones 1508, a video teleconferencing system 1510, a video picture telephone 1512 and the like. The systems 1500 may also comprise a cellular telephone 1514, and a plurality of cell sites 1516 which may be connected with the telephone system 1502. Further, systems 1500 may be computers 1518 connected together through the internet system 1520. Both analog and digital communications are contemplated herein with the various features, advantages and aspects of the present invention.

Other MCM, SCM, mini-board, micro-board, board level and other system sub-assemblies are contemplated using the multi-layer substrate of the present invention. Additionally, such sub-assemblies or packages using such multi-layer substrate circuits may be used in traditional circuit boards or sub-assemblies for a system level product. Examples of electronic systems that may benefit from the system and method of the present invention have been mentioned above. The spirit and intent of the present invention is to utilize multi-layer conductive planes on a substrate for all electronic systems from a single semiconductor integrated circuit die to a complex multiple box electronic system.

The present invention, therefore, is well adapted to carry out the objects and attain the ends and advantages mentioned, as well as others inherent therein. While presently preferred embodiments of the invention and various aspects thereto have been given for purposes of disclosure, numerous changes in the details of construction, interconnection and arrangement of parts will readily suggest themselves to those skilled in the art and which are encompassed within the spirit of the invention and the scope of the appended claims.

While the present invention has been depicted, described, and is defined by reference to particularly preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

The present invention, therefore, is well adapted to carry out the objects and attain the ends and advantages mentioned, as well as others inherent therein.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

For example, on-chip variable transformers can be formed with circuits having on-chip inductors, as described hereinabove, to accommodate voltage and/or load changes experienced by circuitry on the IC chip.

What is claimed is:

1. An integrated circuit (IC) chip comprising:
   a first terminal;
   a second terminal;
   an intermediate node between the first and the second terminal;
   a first passive component connected to the first terminal;
   first switching means for selectively making connections between the first passive component and the intermediate node;
   at least one additional passive component connected to the intermediate node; and
   second switching means for selectively making connections between the at least one additional passive component and the second terminal.

2. An integrated circuit (IC) chip, according to claim 1, wherein:

the first passive component is selected from the group consisting of resistor, capacitor and inductor.

3. An integrated circuit (IC) chip, according to claim 1, wherein:

at least one of the additional passive components is selected from the group consisting of resistor, capacitor and inductor.

4. An integrated circuit (IC) chip, according to claim 1, wherein:

the first passive component is selected from the group consisting of resistor, capacitor and inductor; and the additional passive components are selected from the group consisting of resistor, capacitor and inductor.

5. An integrated circuit (IC) chip, according to claim 1, wherein:

the plurality of first passive components are selected from the group consisting of resistor, capacitor and inductor; and the additional passive components are selected from the group consisting of resistor, capacitor and inductor.

6. An integrated circuit (IC) chip comprising:

a first terminal;

a second terminal;

switching means for selectively making connections;

a first passive component connected between the first terminal and the first switching means; and at least one additional passive component connected between the switching means and the second terminal;

wherein:

the switching means is a programmable matrix circuit (PMC).

7. An integrated circuit (IC) chip, according to claim 6, wherein:

the first passive component is selected from the group consisting of resistor, capacitor and inductor.

8. An integrated circuit (IC) chip, according to claim 6, wherein:

at least one of the additional passive components is selected from the group consisting of resistor, capacitor and inductor.

9. An integrated circuit (IC) chip, according to claim 6, wherein:

the first passive component is selected from the group consisting of resistor, capacitor and inductor; and the additional passive components are selected from the group consisting of resistor, capacitor and inductor.

10. An integrated circuit (IC) chip, according to claim 6, further comprising:

an additional switching means, interposed between the at least one additional passive components and the second terminal, for selectively connecting at least one of the at least one additional passive component to the second terminal.

11. An integrated circuit (IC) chip, according to claim 6, wherein:

the integrated circuit (IC) chip is incorporated into an electronic system selected from the group consisting of general-purpose computer, telecommunication device, network device, consumer device, audio device, video device, receiver, recorder, display device, transportation system, electromechanical device, and smart card.

12. An integrated circuit (IC) chip comprising:

a first terminal;

a second terminal;

an intermediate node between the first and the second terminal;

a plurality of first passive components;

first switching means for connecting selected ones of the first passive components in parallel with one another between the first terminal and the intermediate node;

a plurality of additional passive components; and second switching means for connecting selected ones of the additional passive components in parallel with one another between the intermediate node and the second terminal.

13. An integrated circuit (IC) chip, according to claim 12, wherein:

the plurality of first passive components are selected from the group consisting of resistor, capacitor and inductor.

14. An integrated circuit (IC) chip, according to claim 12, wherein:

the plurality of additional passive components are selected from the group consisting of resistor, capacitor and inductor.

15. Method of establishing a critical parameter of a circuit in an integrated circuit (IC) chip, comprising:

providing a first passive component on the IC chip;

providing a plurality of additional passive components on the IC chip;

connecting selected ones of the additional passive components in parallel with one another, then in series with the first passive component so that the first and the selected ones of the additional components make a critical parameter of a circuit implemented on the IC chip;

wherein the first passive component is one of resistor, capacitor and inductor, and each of the additional passive components is said one of resistor capacitor and inductor.

16. An electronic system incorporating at least one integrated circuit (IC chip), said IC chip comprising:

a first terminal;

a second terminal;

an intermediate node between the first and the second terminal;

a first passive component connected to the first terminal;

first switching means for selectively making connections between the first passive component and the intermediate node;

at least one additional passive component connected to the intermediate node; and second switching means for selectively making connections between the at least one additional passive component and the second terminal.

17. An electronic system, according to claim 15, wherein the electronic system is selected from the group consisting of general-purpose computer, telecommunication device, network device, consumer device, audio device, video device, receiver, recorder, display device, transportation system, electromechanical device, and smart card.

* * * * *